United States Patent [19]

Brigham et al.

[11] Patent Number: 5,714,413
[45] Date of Patent: Feb. 3, 1998

[54] METHOD OF MAKING A TRANSISTOR HAVING A DEPOSITED DUAL-LAYER SPACER STRUCTURE

[75] Inventors: Lawrence N. Brigham; Raymond E. Cotner; Makarem A. Hussein, all of Beaverton, Oreg.

[73] Assignee: Intel Corporation, Santa Clara, Calif.

[21] Appl. No.: 570,726

[22] Filed: Dec. 11, 1995

[51] Int. Cl.[6] .................................................. H01L 21/336
[52] U.S. Cl. ........................... 438/301; 438/303; 438/305
[58] Field of Search .................................. 437/44, 40 SW, 437/41 SW; 438/301, 303, 305

[56] References Cited

U.S. PATENT DOCUMENTS

| 5,079,180 | 1/1992 | Rodder et al. | |
| 5,087,582 | 2/1992 | Campbell et al. | |
| 5,153,145 | 10/1992 | Lee et al. | 437/41 SW |
| 5,234,850 | 8/1993 | Liao | 437/41 SW |
| 5,290,720 | 3/1994 | Chen | 437/41 SW |
| 5,447,872 | 9/1995 | Segawa et al. | 437/41 SW |
| 5,518,945 | 5/1996 | Bracchitta et al. | 437/44 |
| 5,658,815 | 8/1997 | Lee et al. | 438/305 |

Primary Examiner—Charles L. Bowers, Jr.
Assistant Examiner—Lynne A. Gurley
Attorney, Agent, or Firm—Blakely, Sokoloff, Taylor & Zafman

[57] ABSTRACT

A transistor comprising a deposited dual-layer spacer structure and method of fabrication. A polysilicon layer is deposited over a gate dielectric, and is subsequently etched to form the polysilicon gate electrode of the transistor. Next, oxide is deposited over the surface of the gate electrode, followed by deposition of a second dielectric layer. Spacers are then formed adjacent to the gate electrode by etching back the second dielectric layer using a substantially anisotropic etch which etches the second dielectric layer faster than it etches the oxide.

23 Claims, 4 Drawing Sheets

METHOD OF MAKING A TRANSISTOR HAVING A DEPOSITED DUAL-LAYER SPACER STRUCTURE

FIELD OF THE INVENTION

The present invention relates to semiconductor processing and more particularly to a transistor having spacers formed from a deposited dual-layer film.

BACKGROUND OF THE INVENTION

Metal-oxide-semiconductor (MOS) transistors are the primary building blocks for modern integrated circuits. Today, highly complex integrated circuits such as, for example, microprocessors and memory chips, contain millions of transistors on a single silicon substrate no bigger than a thumbnail. A transistor may be thought of as an electronic switch having three nodes. According to a voltage applied to a first node of the transistor, called the gate, the flow of electric current between the other two nodes, called the source and drain, is modulated. For example, to turn one type of n-channel (NMOS) transistor "on," a positive voltage is applied to the gate, allowing electric current to flow between the source and drain. To turn this transistor "off," zero volts is applied to the gate which cuts off the flow of electric current between the source and drain.

As the demand for cheaper, faster, lower power consuming electronic products increases, the speed of the integrated circuits utilized by these devices must be similarly increased. One way to increase the speed of an integrated circuit is to reduce the "switching speed" of the transistors contained within the integrated circuit. The switching speed of a transistor is the amount of time associated with turning the transistor from an "off" state to an "on" state, or from an "on" state to an "off" state. In addition to improving the switching speed of a transistor, the reliability of a transistor must similarly be improved to improve the reliability of the overall integrated circuit.

There are many factors which affect the speed and reliability of a transistor. FIG. 1A shows an edge of a transistor comprising a source/drain tip region 11 formed in a silicon substrate 10. Gate oxide 12 separates polysilicon gate electrode 13 from semiconductor substrate 10. Typically, after tip region 11 is formed in silicon substrate 10 by implanting dopants into the substrate, a reoxidation step is carried out. During reoxidation, the substrate of FIG. 1A is exposed to an oxidizing ambient at elevated temperatures. During reoxidation, any bare silicon exposed to the oxidizing ambient will grow a silicon dioxide (oxide) layer.

FIG. 1B shows the cross-section of FIG. 1A after the substrate has been reoxidized. The exposed silicon of polysilicon gate electrode 13 and silicon substrate 10 combines with oxygen in the oxidizing ambient to grow reox layer 14. Reox layer 14 serves many useful purposes. For example, the reox layer protects the underlying substrate from contamination by subsequently deposited materials such as, for example, photolithographic resist and interlayer dielectrics. The thermal process step used to grow reox layer 14 also helps to repair damage caused by implanting tip region 11.

In addition, reox layer 14 will encroach underneath polysilicon gate electrode 13 within region 15 to round-off and separate the lower corner of the gate electrode from the underlying tip region 11. By separating the gate electrode from the tip region in this manner, the gate-to-source and gate-to-drain capacitance, known as Miller capacitance, is reduced. Reduction in Miller capacitance is known to improve the switching speed of a transistor. Also, the portion of reox layer 14 which grows in region 15 serves to protect the delicate edges of gate oxide 12 from damage and serves to reduce hot electron damage to gate oxide 12, a major reliability concern, during operation of the transistor.

While reox layer 14 provides certain benefits to a transistor, some of which have been described above, the reox layer also introduces some disadvantages. For example, the oxidation enhanced diffusion of tip region 11 caused by the growth of reox layer 14 results in the significant deepening of tip region 11 into silicon substrate 10. Deepening of the tip region has been known to degrade the punchthrough characteristics of the transistor, resulting in functionality and reliability problems, and reduces the usable drive current.

Another disadvantage of reox layer 14 is that the growth of this layer can create crystal defects 16 and 17 in the underlying silicon substrate. Defects 16 and 17 are oxide-induced stacking faults which significantly degrade the performance of the transistor. For example, crystal defects are known to increase leakage currents, degrade gate oxide quality, and reduce the breakdown voltage of the transistor. These problems result in poor yield, reliability, and performance of the overall integrated circuit.

SUMMARY OF THE INVENTION

A transistor comprising a deposited dual-layer spacer structure is described along with its method of fabrication. A polysilicon layer is deposited over a gate dielectric, and is subsequently etched to form the polysilicon gate electrode of the transistor. Next, oxide is deposited over the surface of the gate electrode, followed by deposition of a second dielectric layer. Spacers are then formed adjacent to the gate electrode by etching back the second dielectric layer using a substantially anisotropic etch which etches the second dielectric layer faster than it etches the oxide.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A transistor comprising a spacer structure which overcomes the deficiencies of the prior art is described. In general, in accordance with an embodiment of the present invention, a polysilicon layer is first deposited over the surface of a gate oxide. This polysilicon layer is subsequently patterned and etched to form a polysilicon gate electrode of the transistor. Next, a heavily doped source/drain tip region is formed in the underlying semiconductor substrate adjacent to the edges of the polysilicon gate electrode by implanting a first dose of arsenic for n-channel transistors and boron for p-channel transistors.

Thereafter, a thin silicon dioxide (oxide) layer is conformally deposited over the surface of the substrate, substantially coating the surfaces of the semiconductor substrate and the polysilicon gate electrode. A thicker layer of silicon nitride (nitride) is then deposited conformally over the surface of the oxide layer. The nitride layer is subsequently substantially anisotropically etched back using an etch chemistry which is highly selective to the underlying oxide layer, leaving behind spacers adjacent to the polysilicon gate electrode comprising an upper nitride and a lower oxide. This dual layer spacer structure serves to block the underlying tip region from a subsequent source/drain implant of a second dose of arsenic or boron.

For another embodiment of the present invention, this deposited dual-layer spacer structure is implemented in conjunction with other layers which form a portion of the spacer structure such as, for example, a reox layer. Transistors comprising this deposited dual-layer spacer structure are described in more detail below along with methods of fabricating these devices.

Figure 1A:
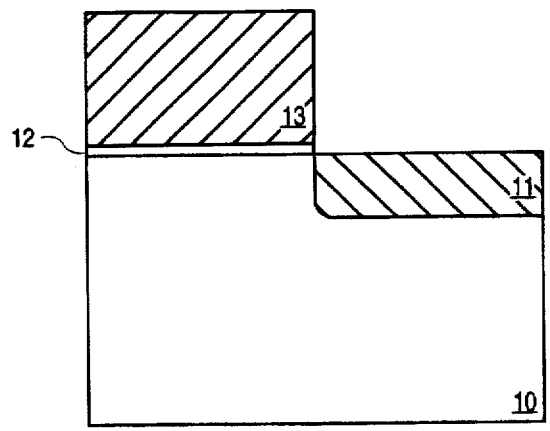
FIG. 1a is a cross-section of the edge of a polysilicon gate electrode formed on a semiconductor substrate.
Figure 1B:
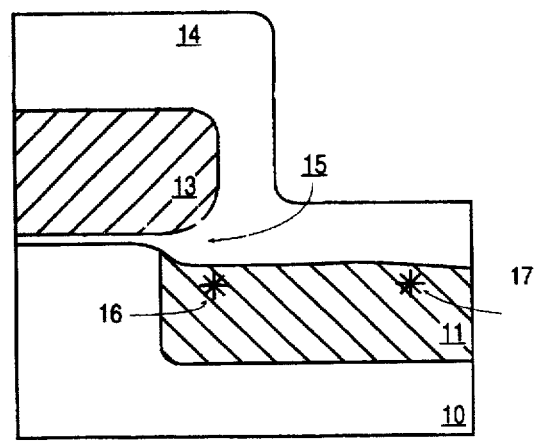
FIG. 1b is the cross-section of FIG. 1a after reoxidation.
Figure 2A:
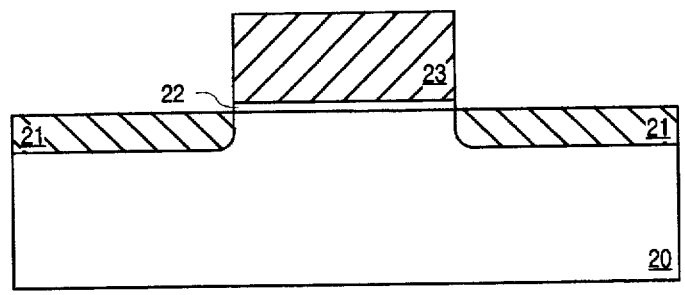
FIG. 2a is a cross-section of a polysilicon gate electrode formed on a semiconductor substrate.

FIG. 2A is a cross-section of a gate dielectric 22 separating a polysilicon gate electrode 23 from an underlying semiconductor substrate 20, having source/drain tip regions 21 formed therein. The structure of FIG. 2A is created by first forming gate dielectric 22 on the surface of bare semiconductor substrate 20. Gate dielectric 22 comprises a layer of thermally grown oxide. For one embodiment, the gate dielectric further comprises a deposited dielectric layer such as oxide or nitride, or a thermal nitride may be formed. After gate dielectric 22 is formed, a layer of polysilicon is deposited on the surface of the gate dielectric. This polysilicon layer is then patterned and etched to form polysilicon gate electrode 23. Thereafter, dopant material is implanted into the surface of semiconductor substrate 20, using gate electrode 23 as an implant mask, to form the inner-portions of the source/drain regions of the transistor, known as source/drain "tip" regions 21, which are substantially aligned to gate electrode 23.

For the embodiment of the present invention shown in FIG. 2A, tip regions 21 are arsenic tip regions formed by implanting a high dose of arsenic at a low energy to form the shallow, heavily doped ($n^+$) tip regions 21. Arsenic is used to form tip regions 21 because arsenic will not rapidly diffuse through semiconductor substrate 20, thereby maintaining the shallow profile and heavily doped nature of these tip regions. An arsenic tip implant of approximately $1\times10^{15}$ ions/cm² at an energy in the range of approximately 2 to 20 KeV has been found suitable for one embodiment, but the actual doseage may vary by approximately an order of magnitude, which is approximately a power of ten, for other embodiments. Also, for alternate embodiments of the present invention, phosphorus or antimony may be used in place of arsenic.

For another embodiment of the present invention in which a p-channel transistor is formed, the p-type tip regions of the transistor are created by implanting a moderate dose of boron at a low energy. A $BF_2$ tip implant of approximately $1\times10^{14}$ ions/cm² at an energy in the range of approximately 2 to 20 KeV has been found suitable for one embodiment, but the actual doseage may vary by approximately an order of magnitude for other embodiments. By forming shallow, relatively heavily doped n-type and p-type tip regions (in comparison to prior art processes) in this manner, the tip becomes an extension of its adjacent, heavily doped source/drain region. This source/drain region is formed later in the process, as described below.

Problems associated with hot electron trapping in the gate dielectric in transistors having heavily doped tip regions are minimized by using lower supply voltages during operation of the transistor. For another embodiment of the present invention, the transistor is operated under higher supply voltage conditions. For this embodiment, $n^-$ tip regions of n-channel transistors are formed by implanting a lower dosage of phosphorus, and $p^-$ tip regions of p-channel transistors are formed by implanting a moderate to low dosage of boron to form graded junction or low doped drain (LDD) tip regions. This embodiment of the present invention may be found useful in reducing the hot electron charging effects to acceptable levels.

For the embodiment of the present invention shown in FIG. 2A, gate dielectric 22 is removed from the surface of semiconductor substrate 20 above tip regions 21 before the tips are implanted. For another embodiment of the present invention, all or some portion of the gate dielectric remains on the surface of the semiconductor substrate during implantation of the tip regions. This embodiment may be found useful in applications in which a practitioner desires to use a screen oxide to reduce damage to the semiconductor substrate and channeling of dopant ions implanted perpendicular to the surface of the substrate. As such, for anther embodiment of the present invention, one or more layers of the subsequently formed spacer structures described below are deposited before the tip regions are formed. This embodiment may be found useful to further minimize the effects of channeling through the semiconductor substrate and to reduce damage to the surface of the substrate.

Figure 2B:
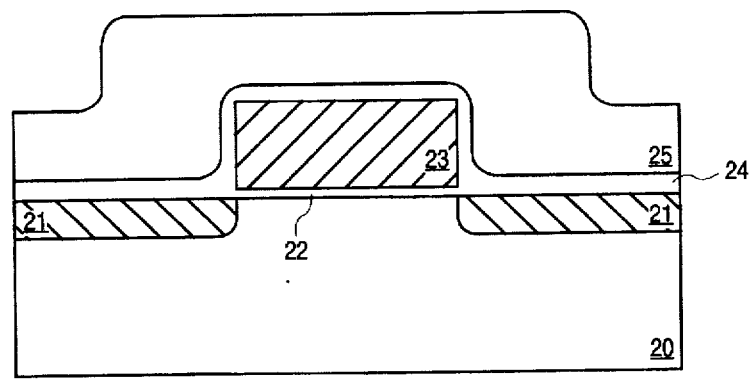
FIG. 2b is the cross-section of FIG. 2a after two dielectric films have been formed in accordance with an embodiment of the present invention.
Figure 2C:
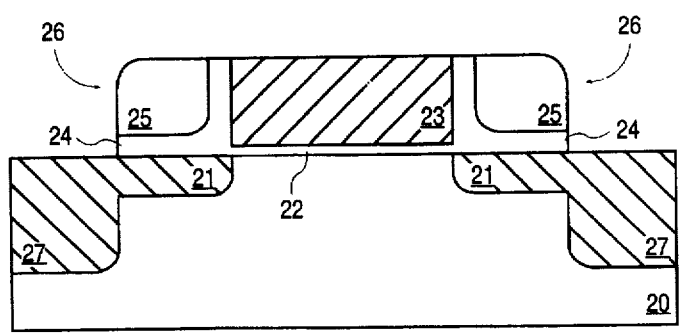
FIG. 2c is the cross-section of FIG. 2b after the dielectric films have been etched back to form spacers.

The width of polysilicon gate electrode 23 (which defines the gate length of the transistor, between the source and drain regions) is approximately 0.3 µm, but may be in the range of approximately 0.1 µm to 1 µm. For another embodiment of the present invention, the width of the gate electrode is well within the deep sub-micron regime of less than 0.1 µm. While the embodiment of the present invention shown in FIGS. 2A–C is in accordance with a complimentary metal oxide semiconductor (CMOS) process, for other embodiments of the present invention, other types of devices are formed. For example, in an embodiment in which an erasable, programmable read-only memory (EPROM) device is formed, a floating gate, control gate dielectric, and control gate are formed over the gate dielectric, and subsequently patterned and etched, before tip regions are formed. Also, for another embodiment of the present invention, materials other than polysilicon, which are also capable of exhibiting conductive properties, are implemented in place of or in addition to the polysilicon.

FIG. 2B shows the cross-section of FIG. 2A after two dielectric films, oxide 24 and nitride 25, have been formed in accordance with an embodiment of the present invention. Dielectric layer 24 is an oxide deposited by a chemical vapor deposition (CVD) process. Oxide 24 is formed to a thickness within the range of approximately 50 Å to 150 Å. One purpose served by oxide layer 24 is as a buffer layer, relieving lateral stresses between the subsequently deposited nitride layer 25 and the underlying polysilicon gate electrode 23. Unless this stress is relieved, cracks, delamination, or other problems can occur in the nitride or polysilicon layers.

Another purpose served by oxide layer 24 is as an etch stop to the subsequent anisotropic nitride spacer etch. Therefore, oxide layer 24 is deposited thick enough to serve as a sufficient buffer between its overlying and underlying materials, and to prevent etching of the underlying material during etching of the overlying material. With these considerations in mind, for one embodiment of the present invention, the thickness of the oxide layer is selected from within the range of approximately 50 Å to 300 Å. For an alternate embodiment of the present invention in which, for example, a more highly selective spacer etch chemistry is used, an oxide less than 50 Å is deposited. For another embodiment of the present invention, an oxide layer as thick as approximately 500 Å may be necessary.

Dielectric layer 25 is a nitride formed by a CVD process to a thickness in the range of approximately 800 Å to 3000 Å. Nitride layer 25 provides the basis from which the bulk of the spacer structures are subsequently formed. One benefit to using nitride in a spacer structure is that nitride provides better hermeticity than oxide. Therefore, nitride layer 25 prevents the diffusion of moisture to gate dielectric 22, thereby improving the electrical stability of the resulting transistor. For an alternate embodiment of the present invention, this second dielectric layer primarily comprises a silicon oxynitride material.

Consistent spacer width is dependent on the thickness and conformality of nitride layer 25. Therefore, the thickness of nitride layer 25 is selected to provide sufficient hermeticity to the underlying transistor, as well as adequate spacer width. For one embodiment of the present invention, the thickness of nitride 25 is selected from within the range of approximately 500 Å, to 2500 Å. Note that as the dimensions of transistors formed in accordance with more advanced processing techniques are reduced, the thickness of the nitride layer is similarly reduced. For example, for one embodiment the nitride layer is deposited to a thickness of less than 500 Å, to perhaps as thin as 100 Å or less.

As stated above, oxide layer 24 is deposited by a CVD process, rather than thermally grown from the surfaces of semiconductor substrate 20 and polysilicon gate electrode 23. As a result, the lower corners of polysilicon gate electrode 23 lie predominantly flat and square with the surface of semiconductor substrate 20, thereby improving the characteristics of the resulting transistor. In addition, because oxide layer 24 is deposited rather than grown, thermal oxide-enhanced diffusion of the source/drain tip regions is minimized, thereby maintaining the shallow profile and highly doped nature of tip regions 21, and providing improved transistor performance.

To minimize the diffusion of tip regions 21 into semiconductor substrate 20, the temperature to which the tip regions are exposed is minimized. Therefore, both dielectric layers 24 and 25 are deposited by low pressure CVD (LPCVD) processes at temperatures below approximately 900° C. For another embodiment of the present invention, the thermal budget seen by tip regions 21 is further reduced by depositing either oxide layer 24, nitride layer 25, or both by a plasma-enhanced CVD (PECVD) process. Because a PECVD process can deposit materials at much lower temperatures than the materials can be deposited using an LPCVD process, the substrate upon which the material is deposited can be kept at a lower temperature. Therefore, for an embodiment in which PECVD is used to deposit the spacer layers, diffusion of the tip regions in the semiconductor substrate is reduced.

FIG. 2C shows the cross-section of FIG. 2B after dielectric films 24 and 25 are etched back to form spacer structures 26 adjacent to polysilicon gate electrode 23, and source/drain regions 27 are subsequently formed. Spacers 26 comprise upper nitride layer 25 and lower oxide layer 24. Dielectric layers 24 and 25 are etched back using two different etch techniques and etch chemistries.

Nitride layer 25 is etched back using a substantially anisotropic etch technique using an etch chemistry which etches nitride faster than it etches oxide. In a substantially anisotropic etch process, the layer being etched is etched primarily in the vertical direction, however, a small amount of horizontal etching (isotropic etch) may be allowed to take place. This slight isotropic component of the etch is enough to remove "micro-spacers" which have been found to form adjacent to very small, non-planar features of the substrate.

Using this etch process, nitride layer 25 of FIG. 2B is reduced to the upper portion of spacers 26. The substantially anisotropic etch of nitride layer 25 removes the nitride from the upper surfaces of the polysilicon gate electrode and the source/drain regions of semiconductor substrate 20 without completely etching through the underlying oxide layer 24. A $SF_6$-based nitride etch chemistry has been found to provide suitable selectivity to oxide. Therefore, by optimizing the nitride spacer etch, along with the thickness of oxide layer 24, the upper nitride portions of spacers 26 are isolated to the regions adjacent to polysilicon gate electrode 23, without removing any portion of polysilicon from the gate electrode, semiconductor material from the surface of semiconductor substrate 20, or trench oxide from trench isolation regions elsewhere in the substrate.

While nitride layer 25 is primarily etched back by the substantially anisotropic spacer etch process, a good portion of the underlying oxide layer 24 will also be etched, particularly during the period of time nitride layer 25 is undergoing overetch by the spacer etch process. Overetch is done to ensure the nitride is completely removed from all regions where the nitride is not desired. Therefore, some small portion of the lower oxide layer remains over the surface of the substrate. Increasing the thickness of this lower remaining oxide layer may be found useful in application in which a screen oxide is desired to reduce the channeling and damage caused by the subsequently implanted dopant ions in the source/drain regions of the transistor.

For an alternate embodiment of the present invention, after the upper nitride layer of the spacer is formed by the substantially anisotropic etch-back process step, the lower oxide layer is separately etched back using an isotropic etch such as, for example, a buffered oxide wet etch comprising HF. During this isotropic etch-back step, the upper nitride portion of the spacer acts as a mask for the underlying oxide layer, preventing the oxide from being removed from the spacer structure. However, elsewhere on the substrate, the oxide layer is substantially removed by the isotropic etch chemistry which etches oxide faster than it etches silicon. For an alternate embodiment of the present invention, the oxide layer is etched by a similarly selective anisotropic etch technique.

For other embodiments of the present invention, other film combinations are deposited from which spacer structures are formed using substantially anisotropic spacer etch chemistries which etch the upper layer of the spacer faster than it etches the lower layer of the spacer. Layers which may be found suitable for forming a spacer structure include oxide, nitride, silicon oxynitride, polysilicon, borosilicate glass (BSG), phosphosilicate glass (PSG), borophosphosilicate glass (BPSG), or organic materials such as polyimide. Also, for another embodiment of the present invention, three or more layers of dielectric or other types of materials are implemented to form multi-layered spacer structures wherein each layer is deposited on the surface of the substrate.

After spacers 26 are formed, n⁺ source/drain regions 27 are created by a high energy and high dose blanket implant of arsenic into the surface of the substrate in the n-channel regions. This arsenic implant heavily dopes the source/drain regions and polysilicon gate electrode of the n-channel transistor. Arsenic, with its low diffusion coefficient, will experience little lateral spreading under spacers 26 during subsequent thermal steps. Too much lateral spreading of the source/drain region is known to reduce the punchthrough voltage and to degrade other electrical characteristics of the transistor. The implant dose used to form arsenic source/drain regions 27 is within approximately 1.5 orders of magnitude of the dose used to form tip regions 21. Note that for other embodiments, phosphorus or antimony may be used to dope the source/drain region.

For example, for an embodiment of the present invention in which arsenic is implanted to form the arsenic tip regions 21 at a dose of approximately $1\times10^{15}$ atoms/cm$^2$ at an energy in the range of approximately 2 to 20 KeV, arsenic source/drain regions 27 are formed at a dose of approximately $5\times10^{15}$ atoms/cm$^2$ at approximately 100 KeV. For another embodiment of the present invention, particularly an embodiment in which a graded junction or LDD tip region is formed, the dose of the tip region is in the range of approximately 1.5 to 3 orders of magnitude less than the dose used to form the source/drain region.

For an embodiment of the present invention in which a p-channel transistor is formed, p-type source/drain regions are created by a blanket implant of boron into the surface of the substrate in the p-channel regions. This boron implant dopes the source/drain regions and polysilicon gate electrode of p-channel transistors. For example, for an embodiment of the present invention in which boron is implanted to form the boron tip regions at a dose of approximately $1\times10^{14}$ atoms/cm$^2$ at an energy in the range of approximately 5 to 15KeV, boron source/drain regions are formed at a dose of approximately $4\times10^{15}$ atoms/cm$^2$ at an energy in the range of approximately 15 to 25 KeV.

As shown in FIG. 2C, spacers 26 define the location of source/drain regions 27. The source/drain implants will be self-aligned to the outer edge of spacers 26. Thus, the spacers allow heavily doped source/drain regions to be formed while protecting the underlying tip regions 21 from further doping. Because the location of source/drain regions 27 is defined by the width of spacers 26, and the width of spacers 26 is closely related to the thickness of oxide layer 24 and nitride layer 25, modulating the thickness of either or both dielectric layers 24 and 25 proportionally modulates the location of source/drain regions 27.

For example, for one embodiment of the present invention the width of the spacers after spacer etch-back are less than or equal to, but proportional to, the total thickness of the deposited oxide and nitride layers from which the spacers are formed. The precise width of the spacers additionally depends on other factors including the uniformity of the deposited layers, the degree of overetch of the spacer etch process, and the isotropic etch component of the substantially anisotropic spacer etch. By properly selecting these parameters along with the thickness of the deposited oxide and nitride layers, the desired spacer width can be achieved.

After source/drain regions 27 are formed adjacent to tip regions 21 within semiconductor substrate 20, the substrate is subjected to an anneal process step. When dopants are first implanted into the substrate, the dopants occupy interstitial sights in the semiconductor substrate. By subjecting the substrate to an anneal process step, the thermal energy associated with annealing is used to move the dopants into substitutional sights to induce electrical activation.

In addition, this thermal operation will cause the dopants in tip region 21 to slightly encroach underneath polysilicon gate electrode 23. If the tip region encroaches too far underneath the polysilicon gate electrode, miller capacitance will increase, degrading the performance of the transistor. However, if the tip region doesn't encroach far enough, a constant electric field will not be attained in the channel region, also degrading the performance of the transistor. By subjecting the tip region to the proper amount of thermal energy during anneal or subsequent processing steps, lateral spreading can be controlled independent of the formation of any reox layer. This allows a practitioner to better optimize the tip encroachment under the gate electrode to improve transistor performance.

After annealing, the substrate of FIG. 2C is subjected to standard processing steps to complete the semiconductor device. For example, for one embodiment, the next step is to deposit a layer of refractory metal such as, for example, titanium, and heating the substrate to form silicide regions on the exposed silicon surfaces of the substrate. Excess, unreacted refractory metal is subsequently removed from the surfaces of the substrate by an etch chemistry which selectively etches titanium and not titanium silicide. Because titanium will not react with either oxide or nitride to form a silicide, the unreacted titanium is removed from the surfaces of the spacers. In this self-aligned silicide process, the spacers serve to separate silicide regions formed on the surface of the polysilicon gate electrode from silicide formed on the surface of the source/drain regions of the semiconductor substrate.

Figure 3A:
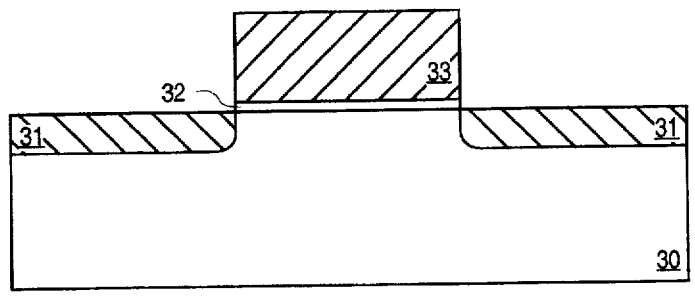
FIG. 3a is a cross-section of a polysilicon gate electrode formed on a semiconductor substrate.

FIGS. 3A through 3D illustrate an alternate embodiment of the present invention in which the dual-layer spacer structure described above is implemented in conjunction with a polysilicon reoxidation (reox) process. FIG. 3A shows a cross-section of gate oxide 32 separating polysilicon gate electrode 33 from the underlying silicon substrate 30. Low doped LDD tip regions 31 are formed by implanting a low dose of phosphorus into silicon substrate 30, using polysilicon gate electrode 33 as a mask, in an n-channel transistor fabrication process. For p-channel transistor fabrication, boron is implanted into the silicon substrate using the polysilicon gate electrode as a mask. Tip regions 31 are formed having a low dopant concentration to help suppress hot electron effects, particularly in applications in which the transistor is to be operated under higher supply voltages (5 volts or more). For an alternate embodiment of the present invention, tip regions 31 are formed by implanting dopants into the silicon substrate after the reox layer, described below, has been formed.

Figure 3B:
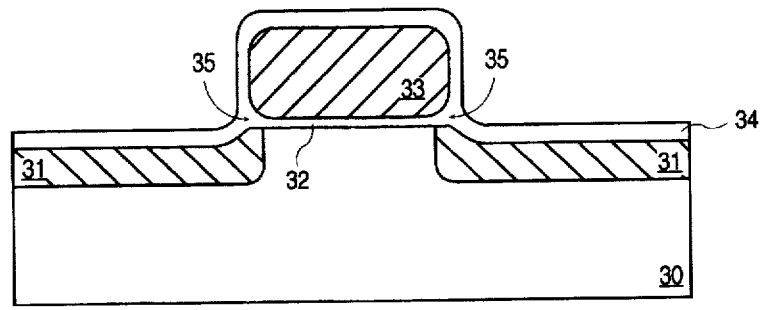
FIG. 3b is the cross-section of FIG. 3a after reoxidizing the substrate in accordance with an embodiment of the present invention.

FIG. 3B shows the cross-section of FIG. 3A, after the exposed surfaces of silicon substrate 30 and polysilicon gate electrode 33 have been oxidized in a thermal oxidizing ambient to form reox layer 34. Reox layer 34 is formed to protect the edges of gate oxide 32 from damage. In addition, reoxidation of the substrate serves to form graded gate oxide regions 35 which round-off and separate the lower corners of polysilicon gate electrode 33 from the inner edges of tip regions 31. As previously discussed, this separation of the gate electrode edges from the source/drain tip regions aids in reducing the Miller capacitance of the transistor, as well as reducing hot electron effects. Reox layer 34 is grown to a thickness within the range of approximately 50 Å to 500 Å.

For an embodiment of the present invention in which bipolar transistors are formed in conjunction with CMOS transistors in a BiCMOS process, the reox layer provides additional benefits to the bipolar transistors. For example, for one embodiment the reox layer additionally serves as the etch stop layer for a polysilicon emitter etch, as well as the dielectric layer which separates the polysilicon emitter from the underlying intrinsic base region of the bipolar transistor.

Because a deposited dual-layer spacer structure, formed in accordance with an embodiment of the present invention, is created adjacent to polysilicon gate electrode 33 as described below, it is not necessary for reox layer 34 to be formed in consideration of the spacer structure. Instead, reox layer 34 is optimized to provide the desired electrical and reliability characteristics for the transistor, without regard to issues such as providing adequate etch stop material for the subsequent spacer etch. Because reox layer 34 is optimized in this manner, the reox layer can be formed much thinner than in prior art processing, thereby reducing or eliminating the crystal defects and oxide-enhanced diffusion associated with the growth of a reoxidation layer.

Figure 3C:
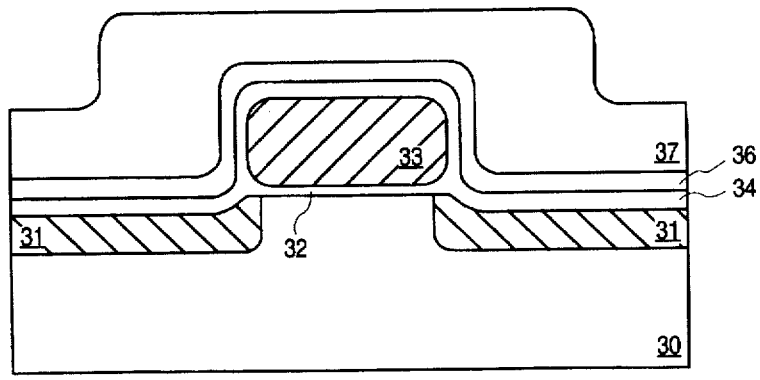
FIG. 3c is the cross-section of FIG. 3b after two dielectric films have been formed in accordance with an embodiment of the present invention.

FIG. 3C shows the cross-section of FIG. 3B after oxide layer 36 and nitride layer 37 are deposited over the surface of the substrate. The thickness of oxide layer 36 is within the range of approximately 50 Å to 300 Å while the thickness of nitride layer 37 is within the range of approximately 800 Å to 3000 Å. Note that for certain embodiments of the present invention, intermediate process steps between the growth of the reox layer and subsequent deposition of the two dielectric layers may etch the reox layer, thereby reducing the thickness of this layer. For example, the etch-back of a second polysilicon layer, formed over the reox layer and used to form the polysilicon emitter of a bipolar transistor in a BiCMOS process, also etches all or a significant portion of the underlying reox layer, which is used as an etch-stop layer.

Figure 3D:
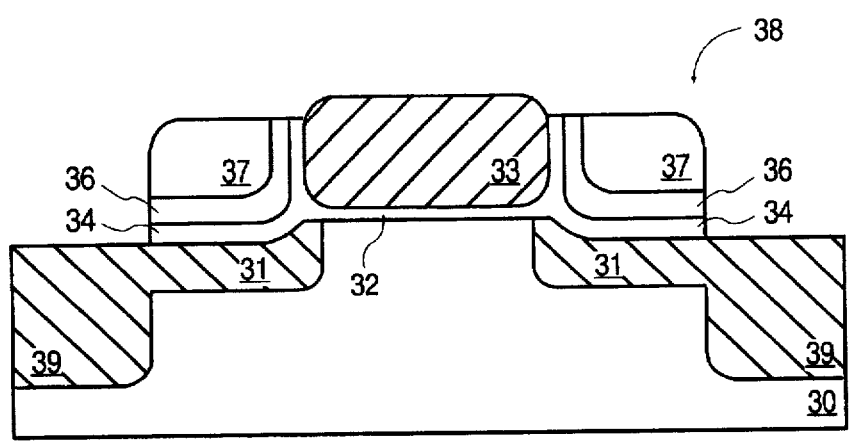
FIG. 3d is the cross-section of FIG. 3c after the dielectric films have been etched back to form spacers.

FIG. 3D shows the cross-section of FIG. 3C after deposited nitride layer 37, deposited oxide layer 36, and grown reox layer 34 are etched back to form spacers 38. Nitride layer 37 is substantially anisotropically etched back using an etch chemistry which etches nitride faster than it etches oxide. For one embodiment of the present invention, a portion of the underlying oxide film is etched back during a nitride overetch process, and some remaining portion of the underlying oxide film will remain on the horizontal surfaces of the substrate during the subsequent source/drain formation process. However, for an alternate embodiment, the underlying oxide film is separately etched back using an etch chemistry which etches oxide faster than it etches silicon. As a result, tri-layer spacer structures 38 are formed comprising a deposited dual-layer spacer structure, including upper nitride layer 37 and lower oxide layer 36, along with an underlying reox layer 34.

After spacer structures 38 are formed, a high dose source/drain implant of arsenic is performed to create n-channel transistor source/drain regions 39 adjacent to tip regions 31, within silicon substrate 30, substantially aligned to the outer edges of spacers 38. The dose used to form the phosphorus tip region is at least 1.5 orders of magnitude less than the dose used to form the n+ arsenic source/drain region of the transistor. Alternatively, phosphorus or antimony may be used to form the n+ source/drain regions of the transistor. For an embodiment of the present invention in which a p-channel transistor is formed, the tip and source/drain regions of the transistor are formed by implanting boron into the semiconductor substrate.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of forming a transistor, comprising the steps of:
   a. forming a gate electrode over a dielectric;
   b. depositing a first dielectric layer over the gate electrode, the first dielectric layer comprising an oxide;
   c. depositing a second dielectric layer over the first dielectric layer;
   d. etching back the second dielectric layer using a substantially anisotropic etch, thereby forming an upper region of a spacer, said spacer adjacent to the gate electrode; and
   e. forming a doped region adjacent to said gate electrode such that said doped region is formed prior to the deposition of said first and second dielectric layers.

2. The method of claim 1, further comprising the steps of implanting a tip region of a first dose after forming the gate electrode, and implanting a source/drain region of a second dose after etching back the second dielectric layer, the first dose being approximately within 1.5 orders of magnitude of the first second dose.

3. The method of claim 1, further comprising the step of etching back the first dielectric layer after etching back the second dielectric layer.

4. The method of claim 1, further comprising the step of oxidizing the gate electrode before depositing the first dielectric layer, thereby forming a reox layer.

5. The method of claim 4, further comprising the steps of implanting a tip region of a first dose after forming the gate electrode, and implanting a source/drain region of a second dose after etching back the second dielectric layer, the first dose being at least 1.5 orders of magnitude less than the second dose.

6. The method of claim 4, further comprising the step of etching back the first dielectric layer and the reox layer after etching back the second dielectric layer.

7. The method of claim 1, wherein the second dielectric layer comprises a nitride.

8. The method of claim 1, wherein the first dielectric layer has a thickness in the range of approximately 50 Å to 300 Å, and the second dielectric layer has a thickness in the range of approximately 800 Å to 3000 Å.

9. The method of claim 4, wherein the reox layer has a thickness in the range of approximately 50 Å, to 500 Å, the first dielectric layer has a thickness in the range of approximately 50 Å, to 300 Å, and the second dielectric layer has a thickness in the range of approximately 800 Å to 3000 Å.

10. The method of claim 2, wherein the tip region and the source/drain region are both implanted with arsenic.

11. The method of claim 2, wherein the tip region and the source/drain region are implanted with a material selected from the group consisting of arsenic, phosphorus, antimony, and boron.

12. A method of forming a transistor, comprising the steps of:
   a. forming a gate electrode over a gate dielectric, the gate electrode comprising polysilicon;

b. depositing a first dielectric layer directly on the gate electrode, the first dielectric layer comprising an oxide;

c. depositing a second dielectric layer directly on the first dielectric layer, the second dielectric layer comprising nitride;

d. etching back the second dielectric layer using a substantially anisotropic etch, thereby forming an upper region of a spacer, said spacer adjacent to the gate electrode; and e. forming a doped region adjacent to said gate electrode such that said doped region is formed prior to the deposition of said first and second dielectric layers.

13. The method of claim 12, further comprising the steps of implanting a first dose of a first dopant in a tip region after forming the gate electrode, and implanting a second dose of a second dopant in a source/drain region after etching back the second dielectric layer, the first dose being within approximately 1.5 orders of magnitude of the second dose, the first and second dopants being selected from a group consisting of arsenic, phosphorous, antimony, and boron.

14. The method of claim 12, further comprising the steps of implanting a tip region of a first dose after forming the gate electrode, and implanting a source/drain region of a second dose after etching back the second dielectric layer, the first dose being less than approximately 1.5 orders of magnitude of the second dose.

15. The method of claim 12, wherein the first dielectric layer has a thickness in the range of approximately 50 Å to 300 Å, and the second dielectric layer has a thickness in the range of approximately 800 Å to 3000 Å.

16. The method of claim 12, wherein the first dielectric layer, comprising oxide, is deposited by a chemical vapor deposition process, and the second dielectric layer, comprising nitride, is deposited by a plasma-enhanced chemical vapor deposition process.

17. A method of forming a transistor, comprising the steps of:

a. depositing a polysilicon layer over a gate dielectric;

b. etching the polysilicon layer to form a polysilicon gate electrode;

c. implanting a first dose of a first dopant to form a tip region;

d. depositing a first dielectric layer directly on the polysilicon gate electrode, after forming said tip region, the first dielectric layer being oxide;

e. depositing a second dielectric layer directly on the first dielectric layer, the second dielectric layer being nitride;

f. etching back the second dielectric layer using a substantially anisotropic etch, thereby forming an upper region of a spacer, said spacer adjacent to the polysilicon gate electrode; and g. implanting a second dose of a second dopant to form a source/drain region.

18. The method of claim 17, further comprising the step of isotropically etching back the first dielectric layer using a wet etch.

19. The method of claim 17, wherein the first dose is within approximately 1.5 orders of magnitude of the second dose, and the first and second dopants are selected from a group consisting of arsenic, phosphorous, antimony, and boron.

20. The method of claim 17, wherein the first dose is less than approximately 1.5 orders of magnitude of the second dose, and the first and second dopants are selected from a group consisting of arsenic, phosphorous, antimony, and boron.

21. The method of claim 17, wherein the first dielectric layer has a thickness in the range of approximately 50 Å, to 150 Å, and the second dielectric layer has a thickness in the range of approximately 500 Å to 2500 Å.

22. The method of claim 17, wherein the second dielectric layer is deposited by a plasma-enhanced chemical vapor deposition process.

23. A method of forming a transistor, comprising the steps of:

a. forming a gate electrode over a dielectric;

b. depositing a first undoped dielectric layer over the gate electrode, the first dielectric layer comprising an oxide;

c. depositing a second dielectric layer over the first dielectric layer; and d. etching back the second dielectric layer using a substantially anisotropic etch, thereby forming an upper region of a spacer, said spacer adjacent to the gate electrode;

e. forming a doped region adjacent to said gate electrode such that said doped region is formed prior to the deposition of said first and second dielectric layers.

* * * * *